(12) United States Patent
Cheng

(10) Patent No.: US 12,349,506 B2
(45) Date of Patent: Jul. 1, 2025

(54) PREPARATION METHOD FOR RESONANT CAVITY LIGHT-EMITTING DIODE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 536 days.

(21) Appl. No.: 17/714,473

(22) Filed: Apr. 6, 2022

(65) Prior Publication Data

US 2022/0231186 A1 Jul. 21, 2022

Related U.S. Application Data

(63) Continuation of application No. PCT/CN2020/130867, filed on Nov. 23, 2020.

(51) Int. Cl.
*H10H 20/81* (2025.01)
*H10H 20/01* (2025.01)
(Continued)

(52) U.S. Cl.
CPC .. *H10H 20/01335* (2025.01); *H10H 20/0137* (2025.01); *H10H 20/8142* (2025.01); *H10H 20/812* (2025.01); *H10H 20/8252* (2025.01)

(58) Field of Classification Search
CPC ... H01L 33/007; H01L 33/0075; H01L 33/06; H01L 33/105; H01L 33/325; H01L 33/385; H01S 5/10
See application file for complete search history.

(56) References Cited

U.S. PATENT DOCUMENTS 6,233,267 B1 * 5/2001 Nurmikko ........... H01S 5/18341
372/50.124
6,515,308 B1 * 2/2003 Kneissl ............... H01S 5/18341
257/E33.044
(Continued)

FOREIGN PATENT DOCUMENTS

CN 1820376 A 8/2006
CN 101523603 A 9/2009
(Continued)

OTHER PUBLICATIONS

International Search Report issued in corresponding PCT Application No. PCT/CN2020/130867, dated Aug. 20, 2021.
(Continued)

*Primary Examiner* — Matthew C Landau
*Assistant Examiner* — Dmitriy Yemelyanov
(74) *Attorney, Agent, or Firm* — Westbridge IP LLC

(57) ABSTRACT

A preparation method for a resonant cavity light-emitting diode comprises: forming a first mirror and a first semiconductor layer on a substrate in sequence; forming an active layer on the first semiconductor layer; and forming a second semiconductor layer and a second mirror on the active layer in sequence. The preparation method further comprises: planarizing at least one of a first contact surface between the first semiconductor layer and the first mirror, and a second contact surface between the second semiconductor layer and the second mirror. Since the first contact surface between the first semiconductor layer and the first mirror, and/or the second contact surface between the second semiconductor layer and the second mirror is planarized, the light emission uniformity of the resonant cavity light-emitting diode can be improved.

11 Claims, 10 Drawing Sheets

(51) Int. Cl.
  *H10H 20/814* (2025.01)
  *H10H 20/812* (2025.01)
  *H10H 20/825* (2025.01)

(56) References Cited

U.S. PATENT DOCUMENTS

| | | | |
|---|---|---|---|
| 2004/0129946 A1* | 7/2004 | Nagai | F21K 9/00 |
| | | | 257/E25.02 |
| 2008/0179605 A1* | 7/2008 | Takase | H01L 33/105 |
| | | | 257/E33.068 |
| 2013/0050686 A1 | 2/2013 | Wunderer et al. | |
| 2018/0006645 A1* | 1/2018 | Kondo | H03K 17/79 |

FOREIGN PATENT DOCUMENTS

| | | | |
|---|---|---|---|
| CN | 103227265 A | | 7/2013 |
| CN | 103325894 A | * | 9/2013 |
| CN | 107078190 A | | 8/2017 |
| JP | 2003017806 A | | 1/2003 |

OTHER PUBLICATIONS

Written Opinion issued in corresponding PCT Application No. PCT/CN2020/130867, dated Aug. 20, 2021.

\* cited by examiner

PREPARATION METHOD FOR RESONANT CAVITY LIGHT-EMITTING DIODE

CROSS-REFERENCE TO RELATED APPLICATIONS

This application is a continuation of International Application No. PCT/CN2020/130867, filed on Nov. 23, 2020, the entire contents of which are incorporated herein by reference.

TECHNICAL FIELD

This application relates to the field of semiconductor technology, and in particular to a preparation method for a resonant cavity light-emitting diode.

BACKGROUND

Group III nitrides are the third-generation new semiconductor materials after the first-generation and second-generation semiconductor materials such as Si and GaAs. Among them, GaN has many advantages as a wide bandgap semiconductor material, such as high saturation drift speed, high breakdown voltage, excellent carrier transport performance, and ability to form AlGaN, InGaN ternary alloys, AlInGaN quaternary alloys, etc., making it easy to fabricate GaN-based PN junctions. In view of this, GaN-based materials and semiconductor devices have received extensive and in-depth research in recent years. The Metal-organic Chemical Vapor Deposition (MOCVD) technology for growing GaN-based materials has become more and more mature. In terms of semiconductor device research, the research of GaN-based LED, LDs and other optoelectronic devices and GaN-based High Electron Mobility Transistor (HEMT) and other microelectronic devices has made remarkable achievements and great progress.

However, in the related art, the light-emitting wavelengths at different positions of the optoelectronic device based on resonant cavity are different, that is, the light-emitting uniformity is poor.

In view of this, it is necessary to provide a new preparation method for a resonant cavity light-emitting diode to solve the above technical problems.

SUMMARY

The purpose of this application is to provide a preparation method for a resonant cavity light-emitting diode, which can improve the uniformity of the light-emitting of the resonant cavity light-emitting diode.

In order to achieve the above objective, the first aspect of this application provides a preparation method for a resonant cavity light-emitting diode.

A preparation method for a resonant cavity light-emitting diode, comprising:
  forming a first mirror and a first semiconductor layer on a substrate in sequence;
  forming an active layer on the first semiconductor layer; and
  forming a second semiconductor layer and a second mirror on the active layer in sequence,
  where the preparation method further comprises: planarizing at least one of a first contact surface between the first semiconductor layer and the first mirror, and a second contact surface between the second semiconductor layer and the second mirror.

Optionally, forming a second semiconductor layer and a second mirror on the active layer in sequence comprises:
  forming a second semiconductor material layer on the active layer;
  obtaining the second semiconductor layer after a surface of the second semiconductor material layer away from the active layer is planarized; and
  forming the second mirror on the second semiconductor layer,
  where planarizing at least one of a first contact surface between the first semiconductor layer and the first mirror, and a second contact surface between the second semiconductor layer and the second mirror comprises:
  planarizing the surface of the second semiconductor material layer away from the active layer.

Optionally, before forming the first mirror and the first semiconductor layer on the substrate in sequence, the method further comprises:
  forming a nucleation layer and a buffer layer on the substrate in sequence.

Optionally, forming a first mirror and a first semiconductor layer on a substrate in sequence comprises:
  forming a first reflective material layer on the substrate;
  obtaining the first mirror after a surface of the first reflective material layer away from the substrate is planarized; and
  forming the first semiconductor layer on the first mirror,
  where planarizing at least one of a first contact surface between the first semiconductor layer and the first mirror, and a second contact surface between the second semiconductor layer and the second mirror comprises:
  planarizing the surface of the first reflective material layer away from the substrate.

Optionally, the first reflective material layer comprises multiple first insulating material layers and second insulating material layers that are alternately arranged.

Optionally, before forming the first reflective material layer on the substrate, the method further comprises:
  forming a nucleation layer and a buffer layer on the substrate in sequence.

Optionally, a conductivity type of the first semiconductor layer is opposite to a conductivity type of the second semiconductor layer.

Optionally, the first semiconductor layer is an N-type semiconductor layer, the second semiconductor layer is a P-type semiconductor layer, and the active layer includes a multiple quantum well structure.

Optionally, the multiple quantum well structure is a periodic structure in which GaN and AlGaN are alternately arranged, or a periodic structure in which GaN and AlInGaN are alternately arranged.

Optionally, a material of the first semiconductor layer comprises a group III-V compound, and a material of the second semiconductor layer comprises a group III-V compound.

Optionally, the resonant cavity light-emitting diode further comprises a third insulating material layer, a fourth insulating material layer, a first electrode and a second electrode; the third insulating material layer is located on a side of the first mirror away from the second mirror, and the first electrode is located on a side of the third insulating material layer away from the first mirror; and
  the fourth insulating material layer is located on a side of the second mirror away from the first mirror, and the second electrode is located on a side of the fourth insulating material layer away from the second mirror, the second electrode contacts the second mirror through a hole on the fourth insulating material layer.

Optionally, planarizing at least one of a first contact surface between the first semiconductor layer and the first mirror, and a second contact surface between the second semiconductor layer and the second mirror comprises:

detecting whether a surface roughness of the first contact surface is within a specified range during the process of planarizing the first contact surface;

if so, stopping planarizing the first contact surface to obtain the second semiconductor layer; and if not, continuing planarizing the first contact surface until the surface roughness of the first contact surface falls within a specified range.

Optionally, planarizing at least one of a first contact surface between the first semiconductor layer and the first mirror, and a second contact surface between the second semiconductor layer and the second mirror comprises:

detecting whether a surface roughness of the second contact surface is within a specified range during the process of planarizing the second contact surface;

if so, stopping planarizing the second contact surface to obtain the first mirror; and if not, continuing planarizing the second contact surface until the surface roughness of the second contact surface falls within a specified range.

This application also provides another preparation method for a resonant cavity light-emitting diode.

A preparation method for a resonant cavity light-emitting diode, comprising:

forming a first semiconductor material layer, an active layer, a second semiconductor layer and a second mirror on a substrate in sequence;

pasting a supporting plate on the second mirror;

turning over an intermediate transition structure comprising the substrate, the first semiconductor material layer, the active layer, the second semiconductor layer, the second mirror and the supporting plate, and peeling off the substrate to expose a third surface of the first semiconductor material layer;

planarizing the third surface to obtain a first semiconductor layer; and forming a first mirror on the first semiconductor layer.

Optionally, before forming the first semiconductor material layer, the method further comprises forming a nucleation layer and a buffer layer on the substrate in sequence, and after peeling off the substrate, the method further comprises peeling off the nucleation layer and the buffer layer to expose the third surface.

Optionally, a conductivity type of the first semiconductor layer is opposite to a conductivity type of the second semiconductor layer.

Optionally, the first semiconductor layer is an N-type semiconductor layer, the second semiconductor layer is a P-type semiconductor layer, and the active layer includes a multiple quantum well structure.

Optionally, forming a second semiconductor layer and a second mirror comprises:

forming a second semiconductor material layer on the active layer;

obtaining the second semiconductor layer after a surface of the second semiconductor material layer away from the active layer is planarized; and forming the second mirror on the second semiconductor layer.

Optionally, a material of the first semiconductor layer comprises a group III-V compound, and a material of the second semiconductor layer comprises a group III-V compound.

Optionally, the resonant cavity light-emitting diode further comprises a third insulating material layer, a fourth insulating material layer, a first electrode and a second electrode; the third insulating material layer is located on a side of the first mirror away from the second mirror, and the first electrode is located on a side of the third insulating material layer away from the first mirror;

the fourth insulating material layer is located on a side of the second mirror away from the first mirror, and the second electrode is located on a side of the fourth insulating material layer away from the second mirror, the second electrode contacts the second mirror through a hole on the fourth insulating material layer.

Compared with the prior art, this application has the following beneficial effects: since the first contact surface between the first semiconductor layer and the first mirror, and/or the second contact surface between the second semiconductor layer and the second mirror is planarized, the uniformity of the distance between the first mirror and the second mirror can be improved, that is, the uniformity of the cavity length of the resonant cavity composed by the first mirror and the second mirror can be improved, thereby improving the uniformity of light emission of the resonant cavity light-emitting diode. In addition, due to the uniform cavity length of the resonant cavity, this solution only allows light with specific wavelength to be emitted. Compared to improving the sensitive elements in the active layer that affect the emission wavelength, such as In element, the solution of improving the uniformity everywhere in the resonant cavity is simple in process and low in cost.

DETAILED DESCRIPTION OF THE EMBODIMENTS

In order to make the above objectives, features and advantages of this application more obvious and understandable, specific embodiments of this application will be described in detail below with reference to the accompanying drawings.

Figure 1:
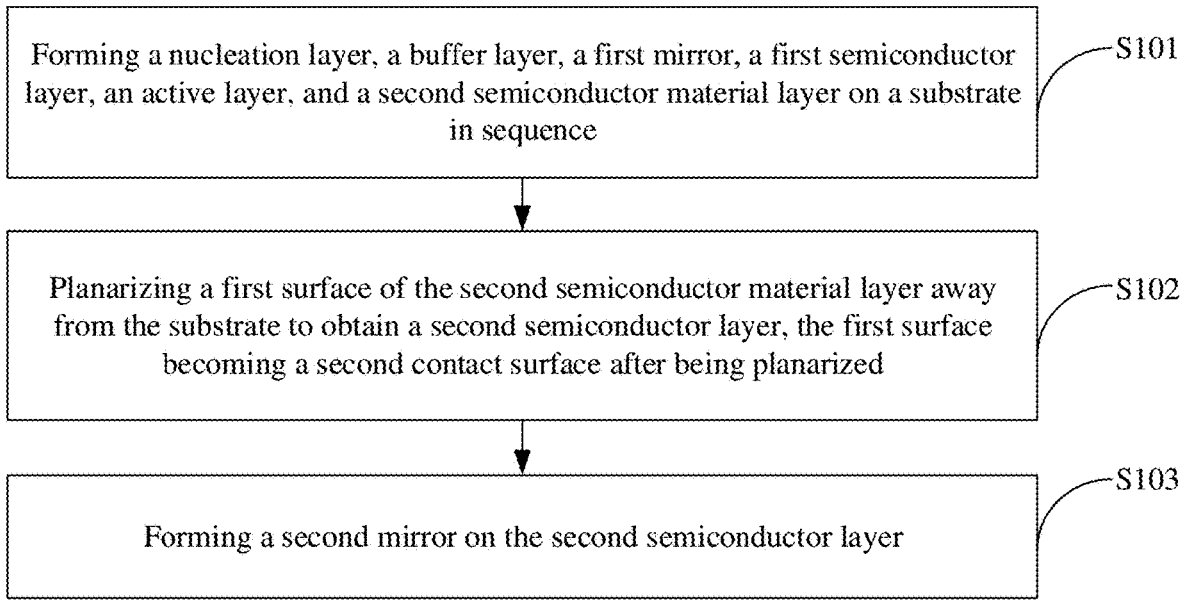
FIG. 1 is a flowchart of a preparation method for a resonant cavity light-emitting diode of a first embodiment of this application.
Figure 2:
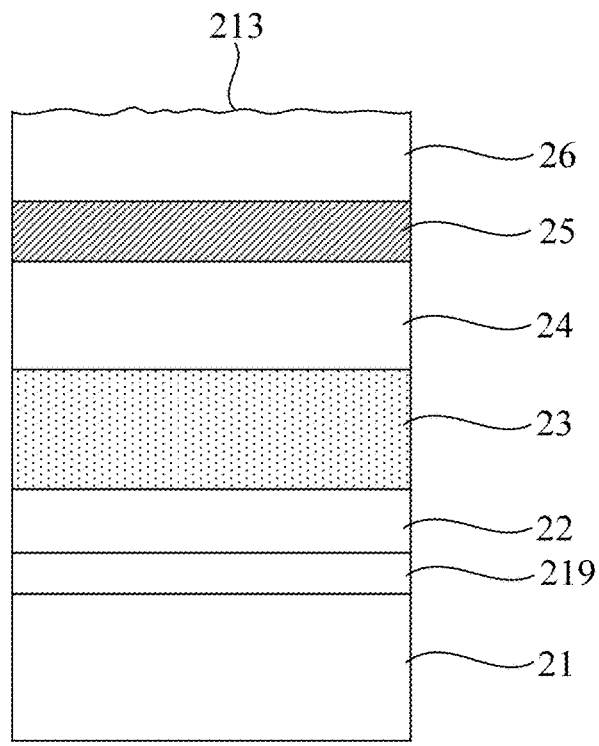
FIG. 2 and FIG. 3 are schematic intermediate structural views corresponding to the processes in FIG. 1.
Figure 3:
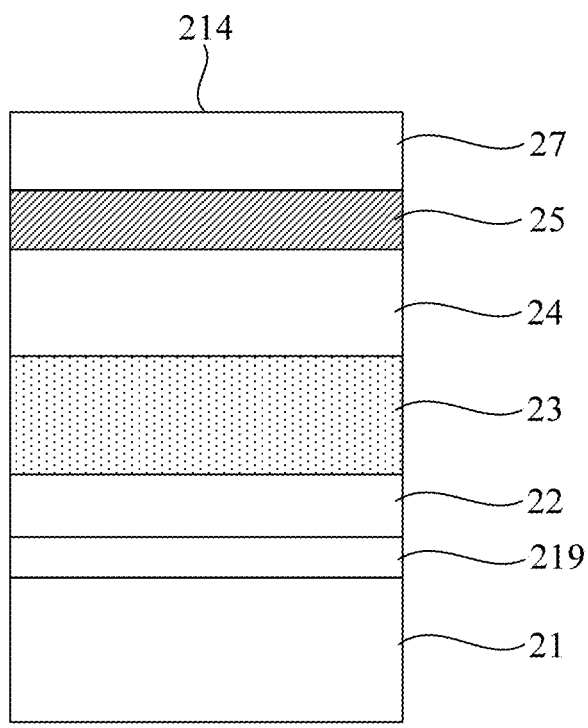
Figure 4:
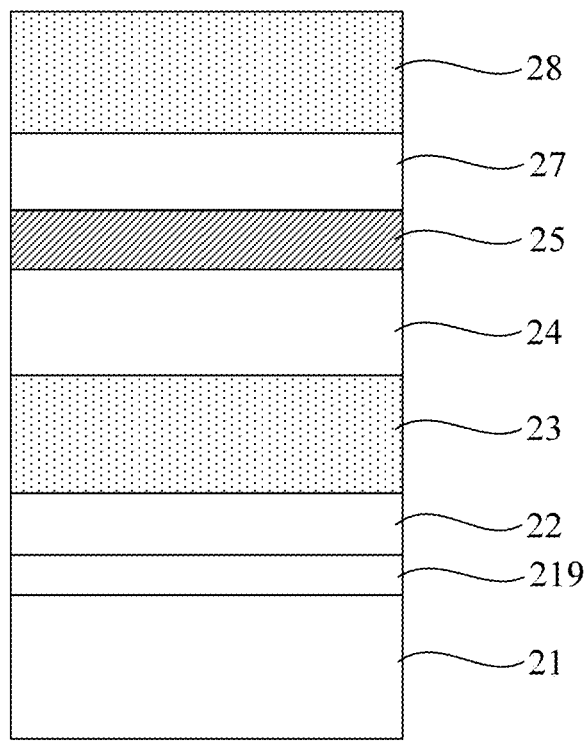
FIG. 4 is a schematic cross-sectional view of the resonant cavity light-emitting diode of the first embodiment of this application.

FIG. 1 is a flowchart of a preparation method for a resonant cavity light-emitting diode of a first embodiment of this application. FIG. 2 to FIG. 3 are schematic intermediate views corresponding to processes in FIG. 1. FIG. 4 is a schematic cross-sectional view of the resonant cavity light-emitting diode of the first embodiment of this application. As shown in FIG. 1, the preparation method for the resonant cavity light-emitting diode includes the following steps S101 to S103.

In step S101, forming a nucleation layer 219, a buffer layer 22, a first mirror 23, a first semiconductor layer 24, an active layer 25, and a second semiconductor material layer 26 on a substrate 21 in sequence.

In this step, as shown in FIG. 2, an epitaxial process can be used to sequentially form the nucleation layer 219, the buffer layer 22, the first mirror 23, the first semiconductor layer 24, the active layer 25, and the second semiconductor material layer 26 on the substrate 21.

In this embodiment, the material of the substrate 21 is silicon. Of course, the material of the substrate 21 may also be silicon carbide (SiC), gallium nitride (GaN) or sapphire.

In this embodiment, the material of the nucleation layer 219 may be a group III-V compound, for example, it may be AlN, or may be GaN, AlGaN, InGaN or AlInGaN.

In this embodiment, the material of the buffer layer 22 may be a group III-V compound, for example, it may be GaN, or may be AlN, AlGaN, InGaN, or AlInGaN.

In this embodiment, the first mirror 23 is a Bragg mirror. The first mirror 23 is formed by alternately arranging a high refractive index material and a low refractive index material. For example, the first mirror 23 includes but not limited to multiple layers of $SiO_2$ and $TiO_2$ that are alternately arranged.

In this embodiment, the first semiconductor layer 24 is an N-type semiconductor layer. The material of the first semiconductor layer 24 is a group III-V compound, such as GaN, or AlN, AlGaN, InGaN, or AlInGaN. The doping element of the first semiconductor layer 24 includes at least one of Si ions, Ge ions, Sn ions, Se ions, and Te ions. For example, the doping element of the first semiconductor layer 24 includes Si ions or includes Si ions and Ge ions, but it is not limited thereto.

In this embodiment, the active layer 25 includes a multiple quantum well structure. The multiple quantum well structure may be, but is not limited to, a periodic structure in which GaN and AlGaN are alternately arranged, or may be a periodic structure in which GaN and AlInGaN are alternately arranged.

In this embodiment, the second semiconductor material layer 26 is a P-type conductive material layer, and the material of the second semiconductor material layer 26 is a group III-V compound, e.g., may be GaN, or may be AlN, AlGaN, InGaN or AlInGaN. The doping element of the second semiconductor material layer 26 includes at least one of Mg ions, Zn ions, Ca ions, Sr ions, and Ba ions, for example, includes Mg ions, or includes Zn ions and Ca ions, but it is not limited thereto.

It should be noted that, as shown in FIG. 2, the first surface 213 of the second semiconductor material layer 26 away from the substrate 21 may have unevenness. If the second mirror 28 is grown directly on it, it may cause the surface of the second mirror 28 facing the first mirror 23 to be uneven and cause the uniformity of the thickness of the epitaxial layer between the second mirror 28 and the first mirror 23 to be poor. This in turn causes the cavity length of the resonant cavity at different positions to be different, that is, the uniformity of the cavity length of the resonant cavity is poor, resulting in poor uniformity of the light emission of the resonant cavity light-emitting diode.

The relationship between the cavity length T of the resonant cavity and the wavelength λ of the light emitted by the resonant cavity light-emitting diode is as follows:

$$\lambda = 2nT/N$$

Where, N is a positive integer.

In step S102, planarizing the first surface 213 of the second semiconductor material layer 26 that is away from the substrate 21 to obtain a second semiconductor layer 27, and the first surface 213 is planarized as the second contact surface 214.

In this embodiment, as shown in FIG. 3, a dry etching process, a wet etching process, or a mechanical polishing process may be used to planarize the first surface 213 of the second semiconductor material layer 26 that is away from the substrate 21 to obtain the second semiconductor layer 27. The first surface 213, after being planarized, becomes a flat second contact surface 214.

In this embodiment, during the process of planarizing the first surface 213, it can be detected whether the surface roughness of the first surface 213 is within a specified range. If so, stop planarizing the first surface 213; if not, continues planarizing the first surface 213 until the surface roughness of the first surface 213 falls within a specified range.

In step S103, forming the second mirror 28 on the second semiconductor layer 27.

In this embodiment, as shown in FIG. 4, the second mirror 28 is formed on the second semiconductor layer 27 by an epitaxial process to form a resonant cavity with the first mirror 23. The structure of the second mirror 28 is similar to that of the first mirror 23, both of which are Bragg mirrors. The second mirror 28 is also formed by high refractive index materials and low refractive index materials that are alternately arranged. For example, the second mirror 28 includes multiple layers of alternately arranged high and low refractive index materials, such as $SiO_2$ and $TiO_2$ alternately arranged.

In this embodiment, since the first surface 213 of the second semiconductor material layer 26 that is away from the substrate 21 is planarized, the second contact surface 214 where the second semiconductor layer 27 contacts the second mirror 28 is flat. The surface of the second mirror 28 facing the first mirror 23 is flat. In this way, the problem of different cavity lengths at different positions of the resonant cavity can be alleviated, that is, the uniformity of the cavity length of the resonant cavity is improved, and uniformity of the thickness of the epitaxial layer between the second mirror 28 and the first mirror 23 is improved, thereby improving the uniformity of light emission of the resonant cavity light-emitting diode. In addition, due to the uniform cavity length of the resonant cavity, this solution only allows light with specific wavelength to be emitted. Compared to improving the sensitive elements in the active layer that affect the emission wavelength, such as In element, the solution of improving the uniformity everywhere in the resonant cavity is simple in process and low in cost.

Figure 5:
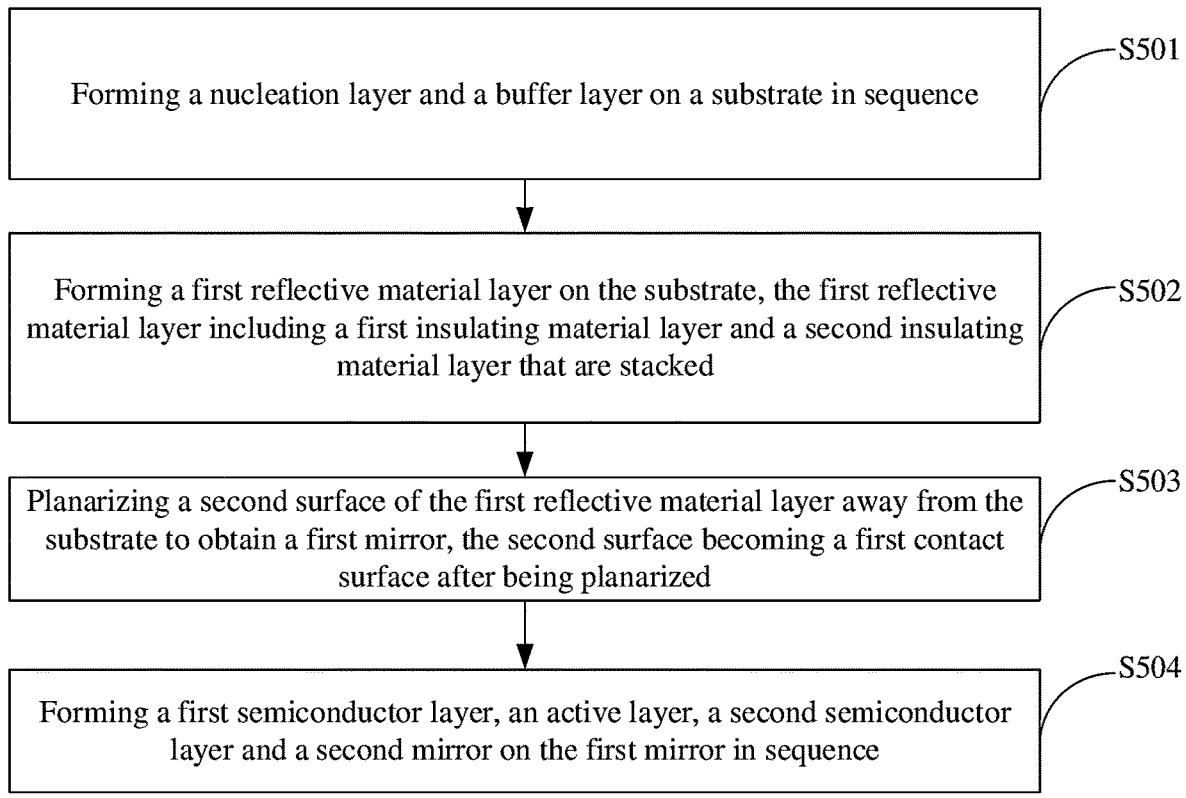
FIG. 5 is a flowchart of a preparation method for a resonant cavity light-emitting diode of a second embodiment of this application.
Figure 6:
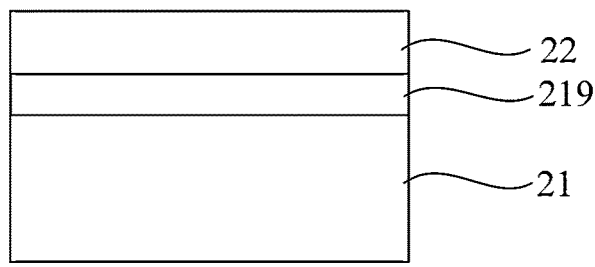
FIG. 6 to FIG. 8 are schematic intermediate views corresponding to processes in FIG. 5.
Figure 7:
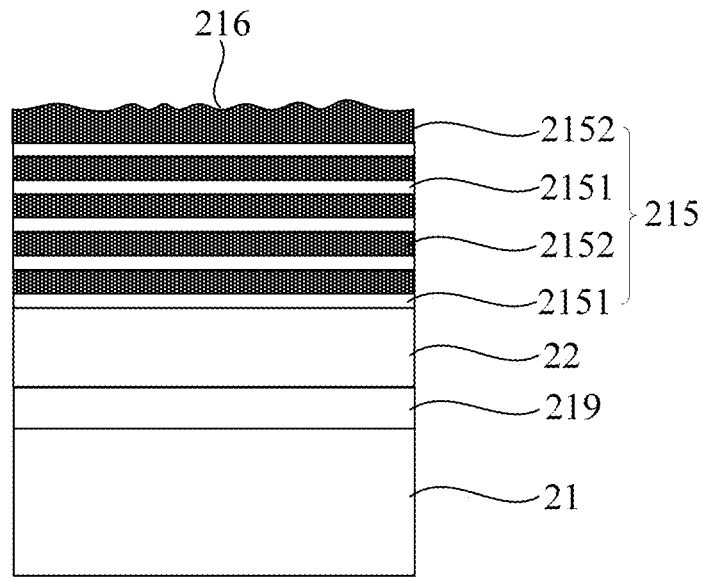
Figure 8:
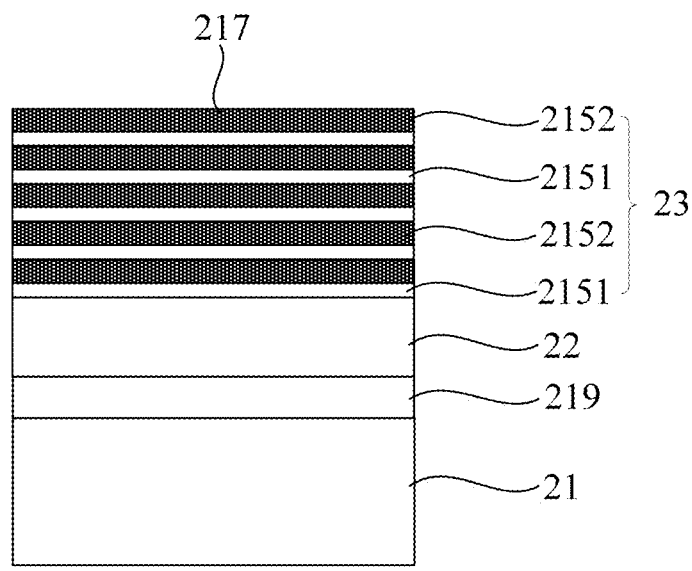
Figure 9:
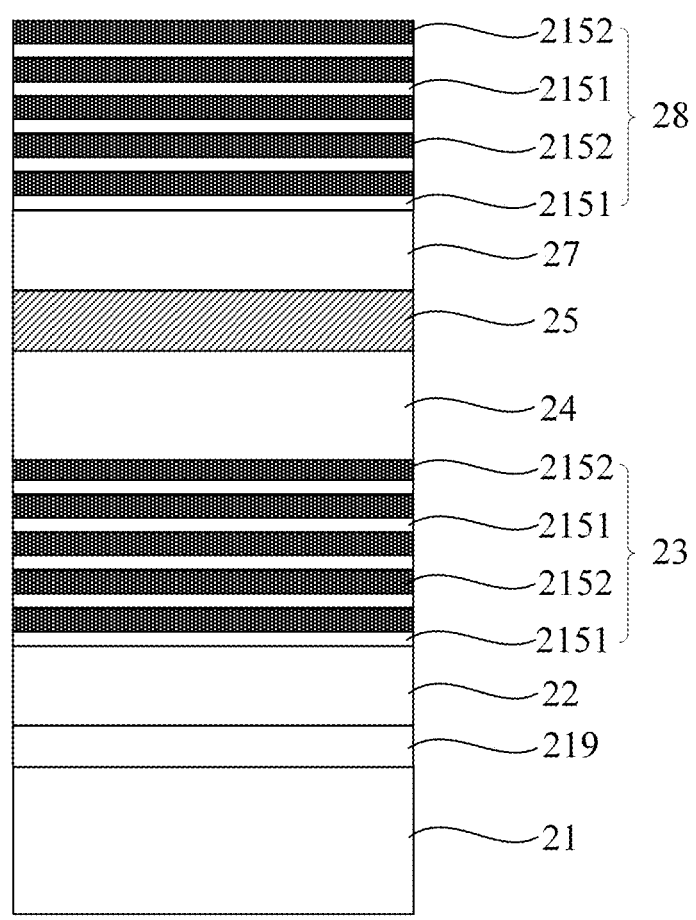
FIG. 9 is a schematic cross-sectional view of the resonant cavity light-emitting diode of the second embodiment of this application.

FIG. 5 is a flowchart of a preparation method for a resonant cavity light-emitting diode of a second embodiment of this application. FIG. 6 to FIG. 8 are schematic intermediate views corresponding to processes in FIG. 5. FIG. 9 is a schematic cross-sectional view of the resonant cavity light-emitting diode of the second embodiment of this application. As shown in FIG. 5, in this embodiment, the preparation method for the resonant cavity light-emitting diode includes the following steps S501 to S504.

In step S501, forming a nucleation layer 219 and a buffer layer 22 on a substrate 21 in sequence.

In this step, as shown in FIG. 6, an epitaxial process is used to sequentially form the nucleation layer 219 and the buffer layer 22 on the substrate 21.

In this embodiment, the material of the substrate 21 may be gallium nitride, or silicon, silicon carbide or sapphire.

In this embodiment, the material of the nucleation layer 219 may be GaN, or may be AlN, AlGaN, InGaN, or AlInGaN.

In this embodiment, the material of the buffer layer 22 may be AlGaN, or GaN, AlN, InGaN, or AlInGaN.

In step S502, forming a first reflective material layer 215 on the buffer layer 22. The first reflective material layer 215 includes a first insulating material layer 2151 and a second insulating material layer 2152 that are stacked.

In this step, as shown in FIG. 7, an epitaxial process is used to form the first reflective material layer 215 on the buffer layer 22, where the first reflective material layer 215 includes multiple first insulating material layers 2151 and second insulating material layers 2152 that are alternately arranged. The material of the first insulating material layer 2151 may be $TiO_2$, and the material of the second insulating material layer 2152 may be $SiO_2$, but it is not limited thereto.

It should be noted that, as shown in FIG. 7, a second surface 216 of the first reflective material layer 215 that is away from the substrate 21 may have unevenness, which will cause the cavity lengths of the resonant cavity at different positions to be different, that is, the uniformity of the cavity length the resonant cavity is poor, and if the first semiconductor layer 24 is grown directly on it, it may cause the surface of the first semiconductor layer 24 facing the first mirror 23 to be uneven and cause the uniformity of the thickness of the epitaxial layer between the second mirror 28 and the first mirror 23 to be poor, resulting in poor uniformity of the light emission of the resonant cavity light-emitting diode.

In step S503, planarizing the second surface 216 of the first reflective material layer 215 that is away from the substrate 21 to obtain the first mirror 23. The second surface 216, after being planarized, becomes a first contact surface 217.

In this embodiment, in the process of planarizing the second surface 216, it can be detected whether the surface roughness of the second surface 216 is within a specified range, if so, stop planarizing the second surface 216, if not, continue planarizing the second surface 216 until the surface roughness of the second surface 216 is within a specified range.

In this step, as shown in FIG. 8, a dry etching process, a wet etching process, or a mechanical polishing process may be used to planarize the second surface 216 of the first reflective material layer 215 that is away from the substrate 21 to obtain the first mirror 23. The second surface 216, after being planarized, becomes the flat first contact surface 217.

In step S504, forming the first semiconductor layer 24, the active layer 25, the second semiconductor layer 27, and the second mirror 28 on the first mirror 23 in sequence.

In this step, as shown in FIG. 9, the first semiconductor layer 24, the active layer 25, the second semiconductor layer 27, and the second mirror 28 are sequentially formed on the first mirror 23 using an epitaxial process.

The first semiconductor layer 24, the active layer 25, the second semiconductor layer 27 in this embodiment and the first semiconductor layer 24, the active layer 25, second semiconductor layer 27 in the first embodiment are similar, which is not repeated here again.

In this embodiment, as shown in FIG. 9, the structure of the second mirror 28 is similar to the structure of the first mirror 23, and both of them are Bragg mirrors, including multiple layers of $SiO_2$ and $TiO_2$ alternately arranged.

In this embodiment, since the second surface 216 of the first reflective material layer 215 that is away from the substrate 21 is planarized, the first contact surface 217 of the first mirror 23 in contact with the first semiconductor layer 24 is flat. The surface of the first mirror 23 facing the second mirror 28 is flat. In this way, the problem of different cavity lengths at different positions of the resonant cavity can be improved, that is, the uniformity of the cavity length of the resonant cavity can be improved, and uniformity of the thickness of the epitaxial layer between the second mirror 28 and the first mirror 23 is improved, thereby improving the uniformity of light emission of the resonant cavity light-emitting diode. In addition, due to the uniform cavity length of the resonant cavity, this solution only allows light with specific wavelength to be emitted. Compared to improving the sensitive elements in the active layer that affect the emission wavelength, such as In element, the solution of improving the uniformity everywhere in the resonant cavity is simple in process and low in cost.

It should be noted that the first embodiment and the second embodiment can be used in combination, so that the surface of the first mirror 23 facing the second mirror 28 is flat, and at the same time, the surface of the second mirror 28 facing the first mirror 23 is also flat. Therefore, the cavity length uniformity of the resonant cavity can be further improved, and the uniformity of the thickness of the epitaxial layer between the second mirror 28 and the first mirror 23 is better, thereby further improving the uniformity of the luminescence of the resonant cavity light-emitting diode.

Figure 10:
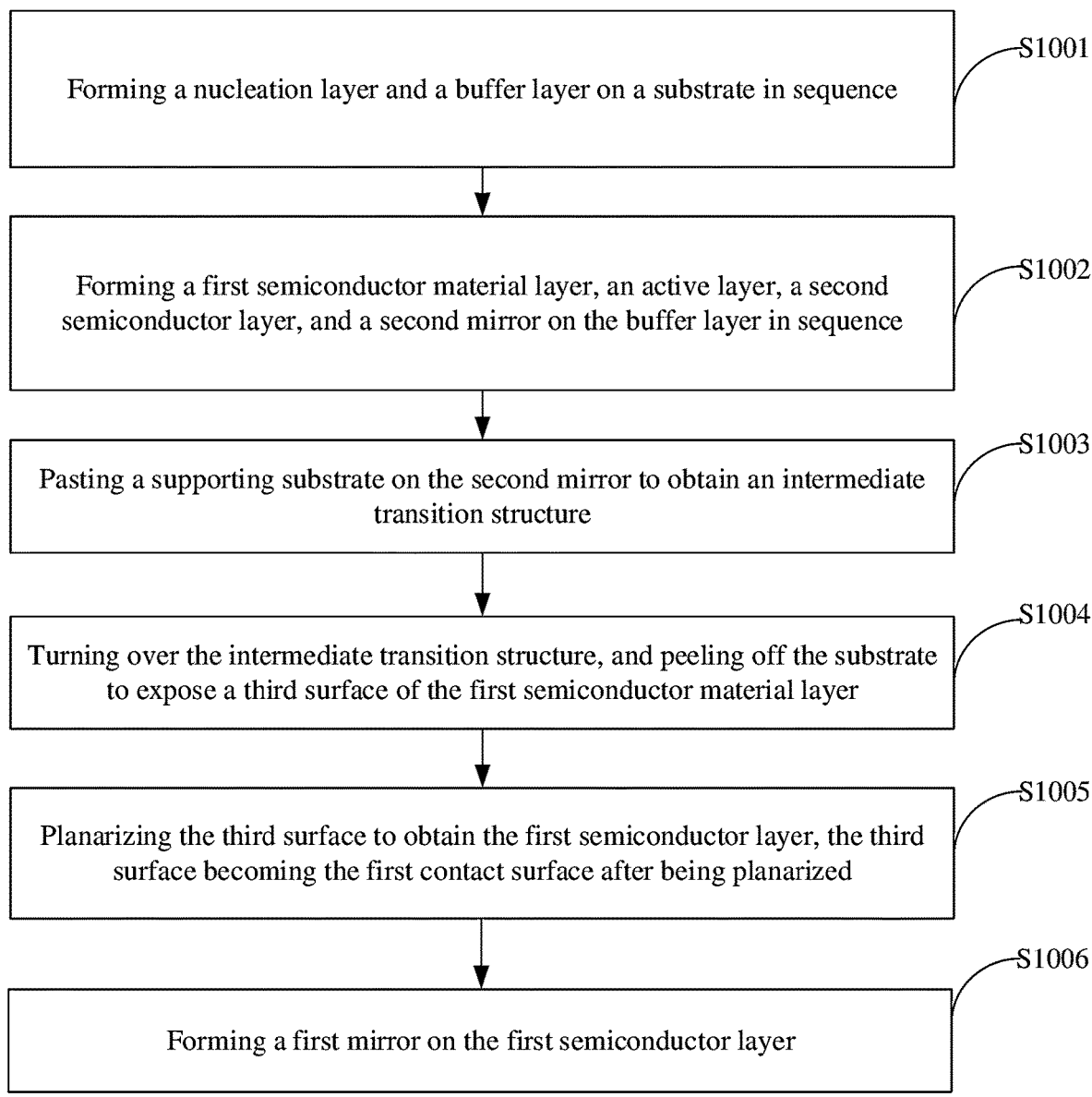
FIG. 10 is a flowchart of a preparation method for a resonant cavity light-emitting diode of a third embodiment of this application.

FIG. 10 is a flowchart of a preparation method for a resonant cavity light-emitting diode of a third embodiment of this application. FIG. 11 to FIG. 15 are schematic intermediate views corresponding to processes in FIG. 10. FIG. 16 is a schematic cross-sectional view of a resonant cavity light-emitting diode of a third embodiment of this application. In this embodiment, the preparation method for the resonant cavity light-emitting diode includes the following steps S1001 to S1006.

In step S1001, forming a nucleation layer 219 and a buffer layer 22 on a substrate 21 in sequence.

Figure 11:
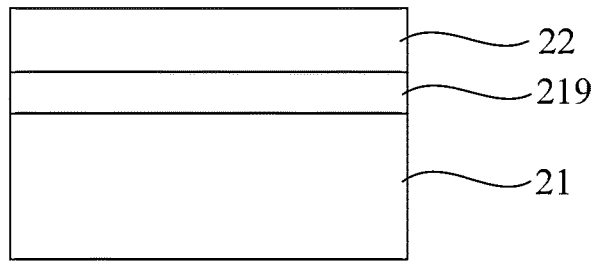
FIG. 11 to FIG. 15 are schematic intermediate views corresponding to processes in FIG. 10.

In this step, as shown in FIG. 11, an epitaxial process is used to sequentially form the nucleation layer 219 and the buffer layer 22 on the substrate 21.

In this embodiment, the material of the substrate 21 may be sapphire, or silicon, silicon carbide, or gallium nitride.

In this embodiment, the material of the nucleation layer 219 may be InGaN, or may be GaN, AlN, AlGaN or AlInGaN.

In this embodiment, the material of the buffer layer 22 may be InGaN, or may be GaN, AlN, AlGaN or AlInGaN.

In step S1002, forming a first semiconductor material layer 29, an active layer 25, a second semiconductor layer 27, and a second mirror 28 on the buffer layer 22 in sequence.

Figure 12:
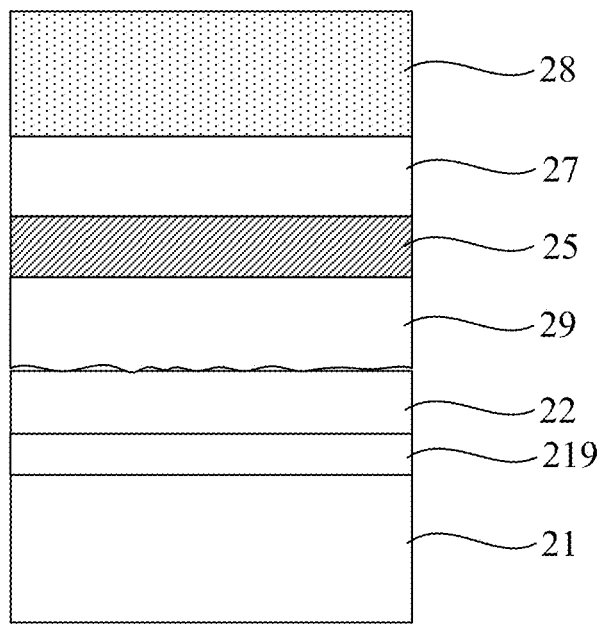

In this embodiment, as shown in FIG. 12, the first semiconductor material layer 29, the active layer 25, the second semiconductor layer 27, and the second mirror 28 are sequentially formed on the buffer layer 22 by using an epitaxial process.

In this embodiment, the first semiconductor material layer 29 is an N-type semiconductor material layer. The material of the first semiconductor material layer 29 is a group III-V compound, such as GaN, or AlN, AlGaN, InGaN, or AlInGaN. The doping element of the first semiconductor material layer 29 includes at least one of Si ions, Ge ions, Sn ions, Se ions, and Te ions. For example, the doping element of the first semiconductor material layer 29 includes Si ions, or includes Si ions and Ge ions, but it is not limited thereto.

In this embodiment, as shown in FIG. 12, the second surface 216 of the first semiconductor material layer 29 facing the buffer layer 22 may have unevenness, which may result in the phenomenon that the uniformity of the thickness of the epitaxial layer between the second mirror 28 and the first mirror 23 is poor, resulting in poor uniformity of light emission of the resonant cavity light-emitting diode.

In step S1003, pasting a supporting plate 211 on the second mirror 28 to obtain an intermediate transition structure 212.

After the above-mentioned step S1003, the intermediate transition structure 212 comprises the substrate 21, the first semiconductor material layer 29, the active layer 25, the second semiconductor layer 27, the second mirror 28 and the supporting plate 211. Generally, the intermediate transition structure 212 refers to the whole structure including every layer by the moment.

Figure 13:
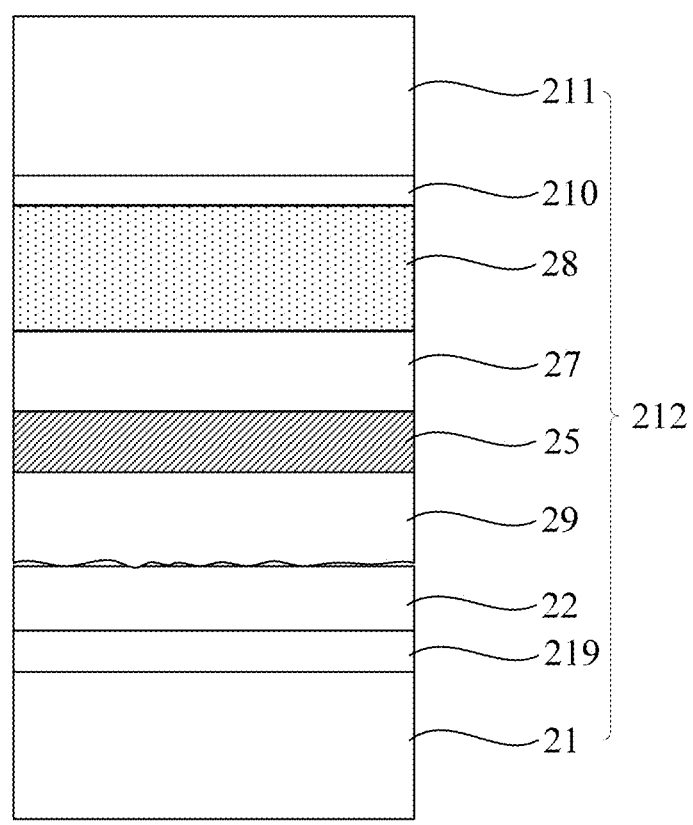

In this embodiment, as shown in FIG. 13, an adhesive layer 210 may be used to paste the supporting plate 211 on the second mirror 28 to obtain the intermediate transition structure 212. The adhesion layer 210 and the supporting plate 211 may be insulating materials. The material of the supporting plate 211 may be silicon. Of course, the material of the substrate 21 may also be silicon carbide, gallium nitride or sapphire.

In step S1004, turning over the intermediate transition structure 212, and peeling off the substrate 21, the nucleation layer 219, and the buffer layer 22 to expose the third surface 218 of the first semiconductor material layer 29.

Figure 14:
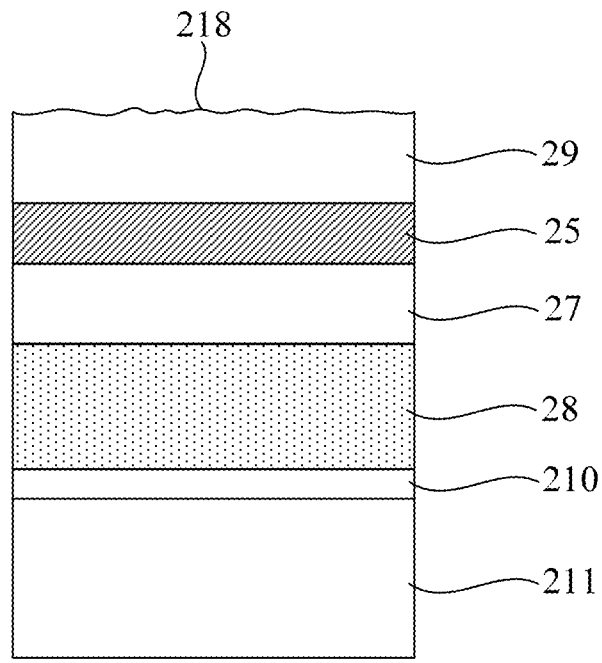

In this embodiment, as shown in FIG. 14, the intermediate transition structure 212 is turned over, and the substrate 21, the nucleation layer 219, and the buffer layer 22 are peeled off, so that the third surface 218 of the first semiconductor material layer 29 is exposed to facilitate planarizing.

In step S1005, planarizing the third surface 218 to obtain the first semiconductor layer 24, and the third surface 218 becomes a first contact surface 217 after being planarized.

Figure 15:
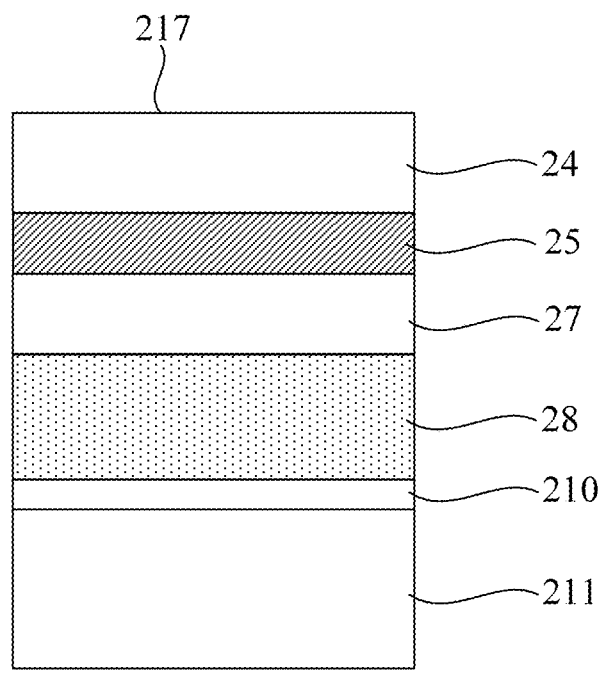
Figure 16:
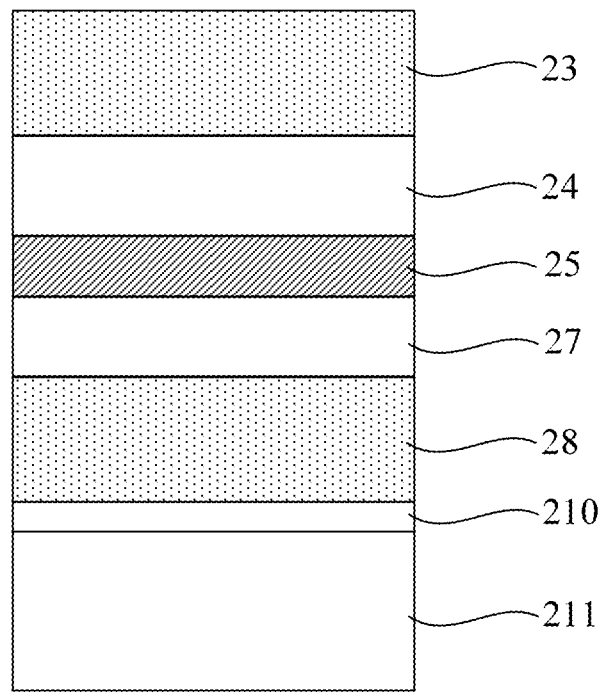
FIG. 16 is a schematic cross-sectional view of the resonant cavity light-emitting diode of the third embodiment of this application.

In this embodiment, as shown in FIG. 15, a dry etching process, a wet etching process or a mechanical grinding process can be used to planarize the third surface 218 so as to obtain the first semiconductor layer 24. The third surface 218 becomes the flat first contact surface 217 after being planarized.

In step S1006, forming a first mirror 23 on the first semiconductor layer 24.

In this embodiment, as shown in FIG. 16, the first mirror 23 is formed on the first semiconductor layer 24 by using an epitaxial process.

In this embodiment, forming a second semiconductor layer 27 and a second mirror 28 may comprise: forming a second semiconductor material layer 26 on the active layer 25; obtaining the second semiconductor layer 27 after a surface of the second semiconductor material layer 26 away from the active layer 25 is planarized; and forming the second mirror 28 on the second semiconductor layer 27.

Detailed description about implementation of these steps is similar as description with regard to FIGS. 2-4. Repetition is therefore omitted here.

In this embodiment, since the third surface 218 of the first semiconductor material layer 29 has been planarized, thus, the first contact face 217 of the first semiconductor layer 24 that is contact with the first mirror 23 is flat. The uniformity of the thickness of the first semiconductor layer 24 is improved, thereby improving the uniformity of the thickness of the epitaxial layer between the second mirror 28 and the first mirror 23, thereby improving uniformity of the light emission of the resonant cavity light-emitting diode. In addition, since the cavity length of the resonant cavity is uniform, this solution only allows light with specific wavelength to be emitted. Compared to improving the sensitive elements in the active layer that affect the emission wavelength, such as In element, the solution of improving the uniformity everywhere in the resonant cavity is simple in process and low in cost.

Figure 17:
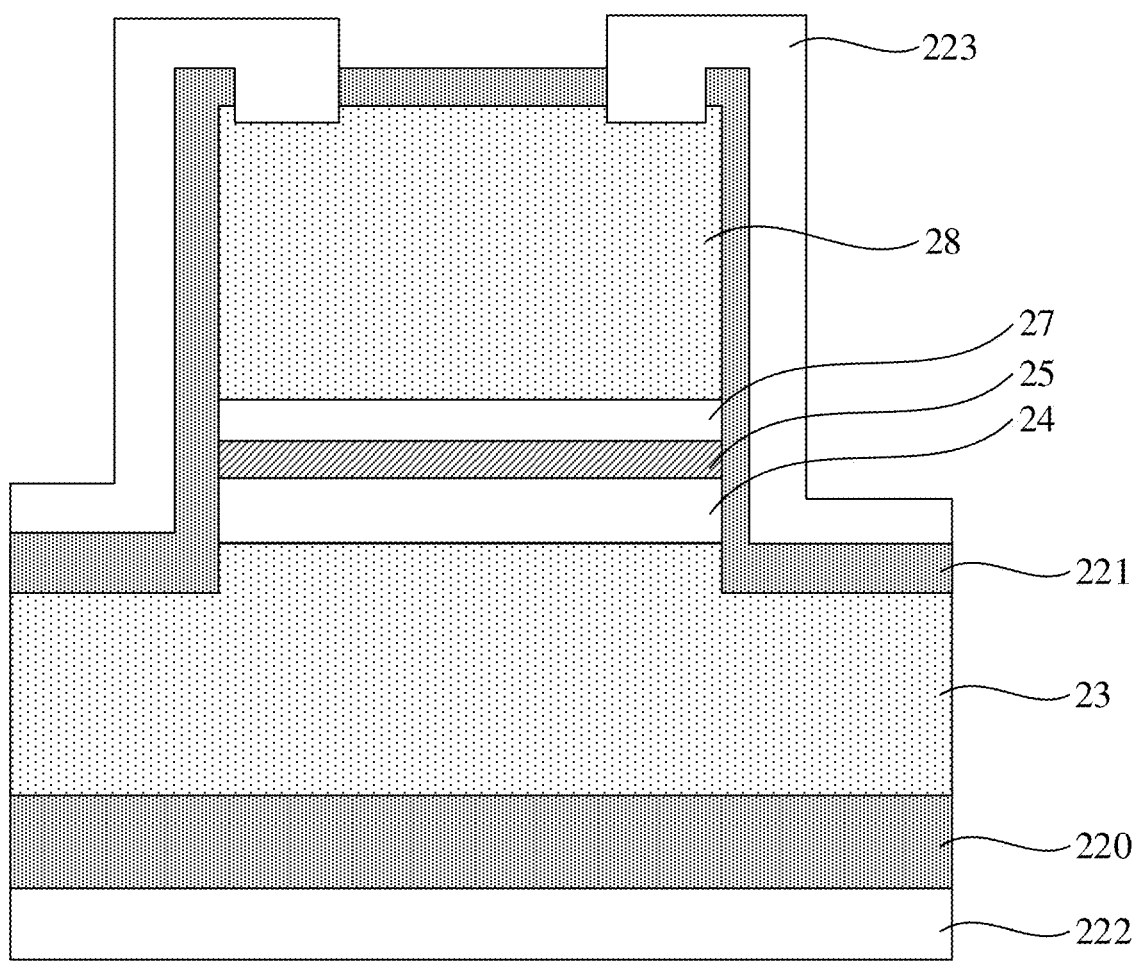
FIG. 17 is a schematic cross-sectional view of a resonant cavity light-emitting diode of a fourth embodiment of this application.

FIG. 17 is a schematic cross-sectional view of a resonant cavity light-emitting diode of a fourth embodiment of this application. In this embodiment, as shown in FIG. 17, the resonant cavity light-emitting diode includes: a first electrode 222, a third insulating material layer 220, a first mirror 23, a first semiconductor layer 24, an active layer 25, a second semiconductor layer 27, a second mirror 28, a fourth insulating material layer 221, and a second electrode 223 that are stacked in sequence.

In this embodiment, as shown in FIG. 17, the second electrode 223 is in contact with the second mirror 28 through the hole on the fourth insulating material layer 221.

The first mirror 23, the first semiconductor layer 24, the active layer 25, the second semiconductor layer 27, and the second mirror 28 that are sequentially stacked in this embodiment can be prepared using a preparation method for a resonant cavity light-emitting diode described in any of the above embodiments.

Although this application is disclosed as above, but it is not limited thereto. Any person skilled in the art can make various changes and modifications without departing from the spirit and scope of this application. Therefore, the protection scope of this application should be subject to the scope defined by the claims.

What is claimed is:

1. A preparation method for a resonant cavity light-emitting diode, comprising:
   forming a first mirror and a first semiconductor layer on a substrate in sequence;
   forming an active layer on the first semiconductor layer; and
   forming a second semiconductor layer and a second mirror on the active layer in sequence,
   wherein the preparation method further comprises: planarizing at least one of a first contact surface between the first semiconductor layer and the first mirror, and a second contact surface between the second semiconductor layer and the second mirror, wherein forming a second semiconductor layer and a second mirror on the active layer in sequence comprises:
   forming a second semiconductor material layer on the active layer;
   obtaining the second semiconductor layer after a surface of the second semiconductor material layer away from the active layer is planarized; and
   forming the second mirror on the second semiconductor layer, wherein the planarizing at least one of the first contact surface between the first semiconductor layer and the first mirror, and the second contact surface between the second semiconductor layer and the second mirror comprises:

planarizing the surface of the second semiconductor material layer away from the active layer; wherein, the second contact surface is the surface of the second semiconductor material layer away from the active layer, and the planarizing at least one of the first contact surface between the first semiconductor layer and the first mirror, and the second contact surface between the second semiconductor layer and the second mirror comprises:

detecting whether a surface roughness of the second contact surface is within a specified range during the process of planarizing the second contact surface;

if so, stopping planarizing the second contact surface to obtain the second semiconductor layer; and if not, continuing planarizing the second contact surface until the surface roughness of the second contact surface falls within a specified range.

2. The preparation method according to claim 1, wherein before forming the first mirror and the first semiconductor layer on the substrate in sequence, the method further comprises:

forming a nucleation layer and a buffer layer on the substrate in sequence.

3. The preparation method according to claim 1, wherein forming a first mirror and a first semiconductor layer on a substrate in sequence comprises:

forming a first reflective material layer on the substrate;

obtaining the first mirror after a surface of the first reflective material layer away from the substrate is planarized; and forming the first semiconductor layer on the first mirror, wherein the planarizing at least one of the first contact surface between the first semiconductor layer and the first mirror, and the second contact surface between the second semiconductor layer and the second mirror comprises:

planarizing the surface of the first reflective material layer away from the substrate.

4. The preparation method according to claim 3, wherein the first reflective material layer comprises multiple first insulating material layers and second insulating material layers that are alternately arranged.

5. The preparation method according to claim 3, wherein before forming the first reflective material layer on the substrate, the method further comprises:

forming a nucleation layer and a buffer layer on the substrate in sequence.

6. The preparation method according to claim 1, wherein a conductivity type of the first semiconductor layer is opposite to a conductivity type of the second semiconductor layer.

7. The preparation method according to claim 1, wherein the first semiconductor layer is an N-type semiconductor layer, the second semiconductor layer is a P-type semiconductor layer, and the active layer includes a multiple quantum well structure.

8. The preparation method according to claim 7, wherein the multiple quantum well structure is a periodic structure in which GaN and AlGaN are alternately arranged, or a periodic structure in which GaN and AlInGaN are alternately arranged.

9. The preparation method according to claim 1, wherein a material of the first semiconductor layer comprises a group III-V compound, and a material of the second semiconductor layer comprises a group III-V compound.

10. The preparation method according to claim 1, wherein the resonant cavity light-emitting diode further comprises a third insulating material layer, a fourth insulating material layer, a first electrode and a second electrode; the third insulating material layer is located on a side of the first mirror away from the second mirror, and the first electrode is located on a side of the third insulating material layer away from the first mirror; and the fourth insulating material layer is located on a side of the second mirror away from the first mirror, and the second electrode is located on a side of the fourth insulating material layer away from the second mirror, the second electrode contacts the second mirror through a hole on the fourth insulating material layer.

11. The preparation method according to claim 3, wherein, the first contact surface is the surface of the first reflective material layer away from the substrate, and the planarizing at least one of the first contact surface between the first semiconductor layer and the first mirror, and the second contact surface between the second semiconductor layer and the second mirror comprises:

detecting whether a surface roughness of the first contact surface is within a specified range during the process of planarizing the first contact surface;

if so, stopping planarizing the first contact surface to obtain the first mirror; and if not, continuing planarizing the first contact surface until the surface roughness of the first contact surface falls within a specified range.

* * * * *